United States Patent [19]
Givens et al.

[11] Patent Number: 5,985,103
[45] Date of Patent: Nov. 16, 1999

[54] METHOD FOR IMPROVED BOTTOM AND SIDE WALL COVERAGE OF HIGH ASPECT RATIO FEATURES

[75] Inventors: John H. Givens, Boise; Richard L. Elliott, Meridian, both of Id.

[73] Assignee: Micron Technology, Inc., Boise, Id.

[21] Appl. No.: 08/911,151

[22] Filed: Aug. 14, 1997

Related U.S. Application Data

[63] Continuation-in-part of application No. 08/574,958, Dec. 19, 1995, Pat. No. 5,658,438.

[51] Int. Cl.$^6$ .................................................. C23C 14/34
[52] U.S. Cl. ........................ 204/192.12; 204/192.17; 204/192.3; 427/569; 427/585; 427/588
[58] Field of Search ................... 204/192.12, 192.15, 204/192.3, 298.11, 192.17, 192.32, 192.25, 192.37; 427/569, 585, 588; 438/478

[56] References Cited

U.S. PATENT DOCUMENTS

| | | | |
|---|---|---|---|
| 3,616,401 | 10/1971 | Cunningham et al. | 204/192.25 |
| 4,702,967 | 10/1987 | Black et al. | 204/192.17 |
| 5,171,412 | 12/1992 | Talieh et al. | 204/192.15 |
| 5,665,659 | 9/1997 | Lee et al. | 204/192.17 |
| 5,725,739 | 3/1998 | Hu | 204/192.3 |
| 5,780,357 | 7/1998 | Xu et al. | 204/192.17 |
| 5,783,282 | 7/1998 | Leiphart | 204/192.17 |
| 5,798,005 | 8/1998 | Murata et al. | 148/421 |

FOREIGN PATENT DOCUMENTS

| | | | |
|---|---|---|---|
| 5-311419 | 11/1992 | Japan | 204/298.11 |
| 5-263222 | 10/1993 | Japan | 204/298.11 |
| 5326426 | 12/1993 | Japan | 204/298.11 |
| 6-136527 | 5/1994 | Japan | 204/298.11 |
| 5-264229 | 9/1994 | Japan | 204/298.11 |

*Primary Examiner*—Nam Nguyen
*Assistant Examiner*—Steven H. VerSteeg
*Attorney, Agent, or Firm*—Workman, Nydegger & Seeley

[57] ABSTRACT

A method is disclosed for improved side wall and bottom coverage of high aspect ratio space situated upon a substrate in two (2) steps. A lining is formed on a side wall surface of the space that terminated at a bottom surface. An opening then remains to a void defined by the lining and the bottom surface. The void is filled with a material passing through the opening to the space. When sputtered, the lining can be formed by a less-collimated sputtered particle flux, and the void can be filled by a collimated sputtered particle flux. The lining can be formed by flux in a plasma formed from a first gas having a neutral to ion ratio, and the void can be filled by a flux in a plasma formed from a second gas having a neutral to ion ratio lower than that of the first. Also, the lining can be formed by a flux in a plasma formed from a first gas having an atomic mass, and the void can be filled by a flux in a plasma formed from a second gas having an atomic mass lower than that of the first. The lining can be formed by sputtering a target having a crystal structure not preferentially oriented to maximize collimation thereof, and the void can be filled with a flux from a target having a crystal structure preferentially oriented to maximize collimation thereof. A confining magnetic field may be used to reduce electron losses at process chamber walls, allowing for improved collimation of the collimated flux. The substrate may also be heated or biased during exposure to the less-collimated flux to increase the good side wall and step coverage of the less-collimated flux, and cooled or reverse-biased during exposure to the collimated flux to increase the good bottom coverage of the collimated flux. Alternatively, the substrate may be exposed to only a collimated flux, but good side wall coverage can be achieved by alternating the temperature and/or bias of the substrate to provide the desired side wall and step coverage. Varied pressure can also be used to adjust material deposition.

67 Claims, 3 Drawing Sheets

METHOD FOR IMPROVED BOTTOM AND SIDE WALL COVERAGE OF HIGH ASPECT RATIO FEATURES

This is a Continuation-In-Part of U.S. patent application Ser. No. 08/574,958 filed Dec. 19, 1995, now U.S. Pat. No. 5,658,438 titled Sputter Deposition Apparatus and Method for Improved Bottom and Side Wall Coverage of High Aspect Ratio Features, filed on Dec. 19. 1995, which is incorporated herein by reference.

BACKGROUND OF THE INVENTION

1. The Field of the Invention

The present invention relates to the manufacture of semiconductor devices. More particularly, the present invention is directed to methods for providing improved bottom and side wall coverage of high aspect ratio features in the manufacture of a semiconductor device.

2. The Relevant Technology

The ever increasing circuit density of state of the art semiconductor devices has resulted in increasing aspect ratios for various structures formed during the manufacture of integrated circuits. Particularly for such structures as contacts and vias, higher aspect ratios have had a negative effect on fabrication yields. Aspect ratio, defined herein as the height of a feature with respect to the width thereof, is considered to be a high if it is at least 2 to 1. Adequate bottom coverage of high aspect ratio contacts and vias has been somewhat difficult to achieve. To provide a deposition system capable of depositing a film with adequate bottom coverage of high aspect ratio features, collimated sputtering is typically employed. But when deposition is performed in a collimated sputtering system with sufficient collimation to provide adequate bottom coverage of high aspect ratio features, then the side walls of high aspect ratio features can be left without adequate coverage. Decreasing the collimation, by, for example, decreasing the collimator aspect ratio, can result in pinching off of the high aspect ratio space before adequate bottom coverage can occur. Thus a method of providing adequate coverage both of side walls and of bottom surfaces of high aspect ratio features is needed.

SUMMARY OF THE INVENTION

In accordance with the present invention, side wall and bottom coverage of a space situated upon a substrate is achieved in two (2) steps. The space has a side wall surface and a bottom surface, and may have an aspect ratio of at least 2 to 1. First. a lining is formed on the side wall surface of the space. The bottom surface of the space is not substantially covered by the lining. The lining with the bottom surface then define a void within the space. The space has an opening thereto. Second, the void is filled with a material passing through the opening to the space. The material substantially covers the lining and may also substantially cover the bottom surface of the space.

The lining can be filled by physical vapor deposition, while the void can be formed either by physical vapor deposition or by chemical vapor deposition. When sputtered, the lining can be formed by a less-collimated sputtered particle flux, and the void can be filled by a collimated sputtered particle flux. Alternatively, the lining can be formed by a particle flux sputtered in a sputtering plasma formed from a first gas having a neutral to ion ratio, and the void can be filled by a particle flux sputtered in a sputtering plasma formed from a second gas having a neutral to ion ratio lower than that of the first gas. Also, the lining can be formed by a particle flux sputtered in a sputtering plasma formed from a first gas having an atomic mass, and the void can be filled by a particle flux sputtered in a sputtering plasma formed from a second gas having an atomic mass lower than that of the first gas. As a further alternative, the lining can be formed by sputtering a target having a crystal structure not preferentially oriented to maximize collimation thereof, and the void can be filled with a particle flux sputtered from a target having a crystal structure preferentially oriented to maximize collimation thereof.

A confining magnetic field may be used to reduce electron losses at process chamber walls, allowing for improved collimation of the collimated flux.

The substrate may also be heated or biased during exposure to the less-collimated flux to increase the good side wall and step coverage of the less-collimated flux, and cooled or reverse-biased during exposure to the collimated flux to increase the good bottom coverage of the collimated flux. Alternatively, the substrate may be exposed to only a collimated flux, but good side wall coverage may be achieved by alternating the temperature and/or bias of the substrate to provide the desired side wall coverage. Sputtering pressure variations may also be used to assist in providing a collimated and a less-collimated flux.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention is a method for improving bottom coverage and side wall coverage of a high aspect ratio feature of a semiconductor device.

Figure 1:
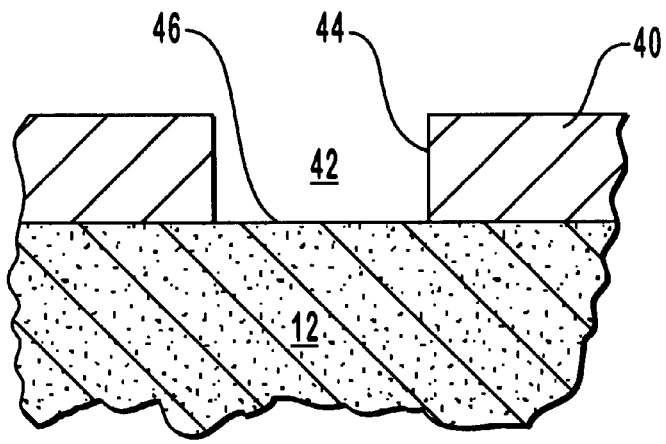
FIG. 1 is a schematic cross section of a portion of a semiconductor device not necessarily drawn to scale or to proportion.
Figure 2:
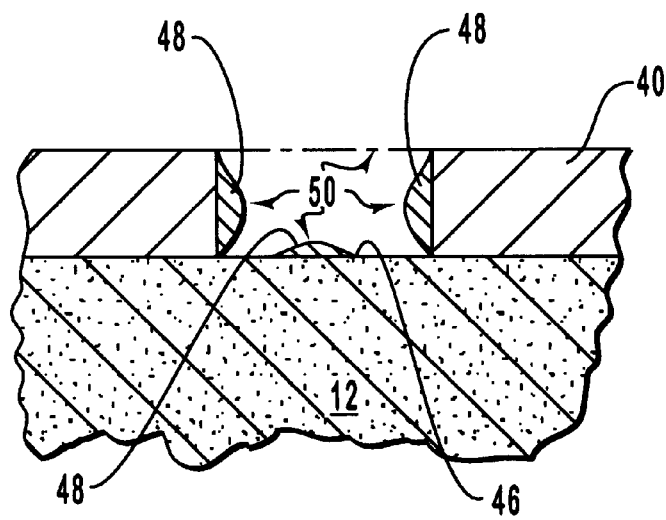
FIG. 2 is an illustration of FIG. 1 after further processing according to the inventive method.

In FIG. 1 a space 42 is on a substrate 12 and situated within layer 40. Space 42 has a side wall surface 44 and a bottom surface 46. First, a lining 48. seen in FIG. 2, is formed on side wall surface 44 of the space 42. A lesser portion of lining 48 may also be formed upon bottom surface 46, but does not substantially cover bottom surface 46. Lining 48 with bottom surface 46 then define a void 50 within the space 42. Lining 48 is formed by deposition of a lining material in a direction that is not substantially parallel to side wall surface 44 of space 42. Space 42 has an opening 52 thereto. Bottom surface 46 of space 42 is not substantially covered by lining 48. Preferably, the width of space 42 will be one half of less the height of space 42, such that the aspect ratio of space 42 will be at least 2 to 1.

Figure 3:
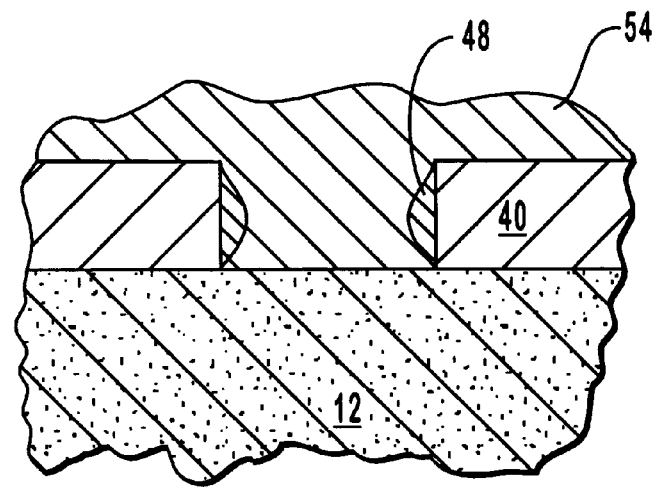
FIG. 3 is an illustration of FIG. 2 after further processing according to the inventive method.

Void 50 is filled with a material 54 passing through opening 52, as is illustrated in FIG. 3. Preferably, but not mandatorily, material 54 passes through opening 52 in a direction that is substantially parallel to side wall surface 44 of space 42. Material 54 substantially covers lining 48 and may also substantially cover bottom surface 46 of space 42. Thus, only two steps are required to fill space 42. In formation of liner 48, the method provides good side wall coverage but not good bottom coverage. In the filling of void 50, good bottom coverage is provided but good side wall coverage is not necessarily provided.

Lining 48 is preferably formed by physical vapor deposition, while void 50 can be filled by physical vapor deposition or by chemical vapor deposition. When lining 48 is formed by a less-collimated sputtered particle flux, void 50 is filled by a collimated sputtered particle flux. Alternatively, when lining 48 is formed by a particle flux sputtered in a sputtering plasma formed from a first gas having a neutral to ion ratio, void 50 is filled by a particle flux sputtered in a sputtering plasma formed from a second gas having a neutral to ion ratio lower than that of the first gas. As a variation of the foregoing, when lining 48 is formed by a particle flux sputtered in a sputtering plasma formed from a first gas having an atomic mass, then void 50 is to be filled by a particle flux sputtered in a sputtering plasma formed from a second gas having an atomic mass lower than that of the first gas.

Where lining 48 is formed by sputtering, a target having a crystal structure not preferentially oriented to maximize collimation thereof can be used. Where void 50 is filled by sputtering, void 50 can be filled with a particle flux sputtered from a target having a crystal structure preferentially oriented to maximize collimation thereof. Also in sputtering, substrate 12 can be in a first position for formation of lining 48 and a second position for filling of he void, where the first and second position can be, but need not be, the same. Where at least one of the forming of lining 48 and the filling of void 50 is a process of sputtering a target, it may be preferable to provide a confining magnetic field extending from the target being sputtered to substrate 12 to confine electrons.

The method disclosed herein may be supplemented by techniques for altering the deposition characteristics. Such techniques presently preferred include varying the temperature of substrate 12 and varying the bias of substrate 12. Higher substrate temperatures may be used to increase the migration of adatoms deposited during either collimated or less-collimated deposition, but preferably only during less-collimated deposition. A substrate bias may be provided to produce a desired degree of re-sputtering of the deposited film, preferably during less-collimated deposition. Higher substrate temperature and substrate bias may even be used individually or together with a collimated particle flux to achieve side wall coverage such that alternation of the flux type is not required, only alternation of substrate 12 temperature and bias. Low substrate temperature and a reverse bias on substrate 12 may also be used during collimated deposition to improve bottom coverage by reducing adatom migration and resputtering of the deposited film. The pressure at which the sputter deposition is performed may be varied. Higher pressures are associated with a shorter mean free path for sputtered particles, resulting in more scattering and less collimation. Hence pressure variation may be used to assist in providing a collimated and a less-collimated flux.

As examples of the supplemental techniques for altering the deposition characteristics, lining 48 can be formed while applying a bias voltage at said substrate within the range of about −30 to about −500 V to provide a beneficial level of resputtering of the deposited film, and void 50 can be filled by while applying a bias voltage at substrate 12 within the range of about −30 to about 100 V (low, zero, or reverse bias) to inhibit resputtering. Alternatively, lining 48 can be formed while substrate 12 is heated within the range of about 150° C. to about 700° C. to increase adatom migration and void 50 can be filled by while substrate 12 is heated within the range of about −15° C. to about 150° C. to decrease such migration. A less-collimated flux may be produced for the formation of the liner at a relatively high pressure range of about 2 mTorr to 10 mTorr, while a more collimated flux may be produced for the filling of void 50 at a range of about 0.1 mTorr to 2 mTorr. Additionally, lining 48 can be formed while applying a pressure to substrate 12 in a range from about 2 mTorr to about 10 mTorr, and void 50 can be filled by while applying a pressure to substrate 12 in a range from about 0.1 mTorr to about 2 mTorr. Combinations of these ranges for bias, temperature and pressure can also be used.

The above method may be carried out in any number of ways. Substrate 12 may be held in place while less-collimated and collimated fluxes are directed at substrate 12. The less-collimated and collimated fluxes may for example be from the same target with a removable collimator providing the adjustment to the degree of collimation. The less-collimated and collimated fluxes may originate from different targets. The sputtering agent and power source may likewise be the same or different for the less-collimated and collimated fluxes. Substrate 12 may also be rotated or otherwise moved out from one flux and into the other. Presently preferred ways and presently preferred equipment for performing the above method are explained below with reference to FIGS. 4–6.

Figure 4:
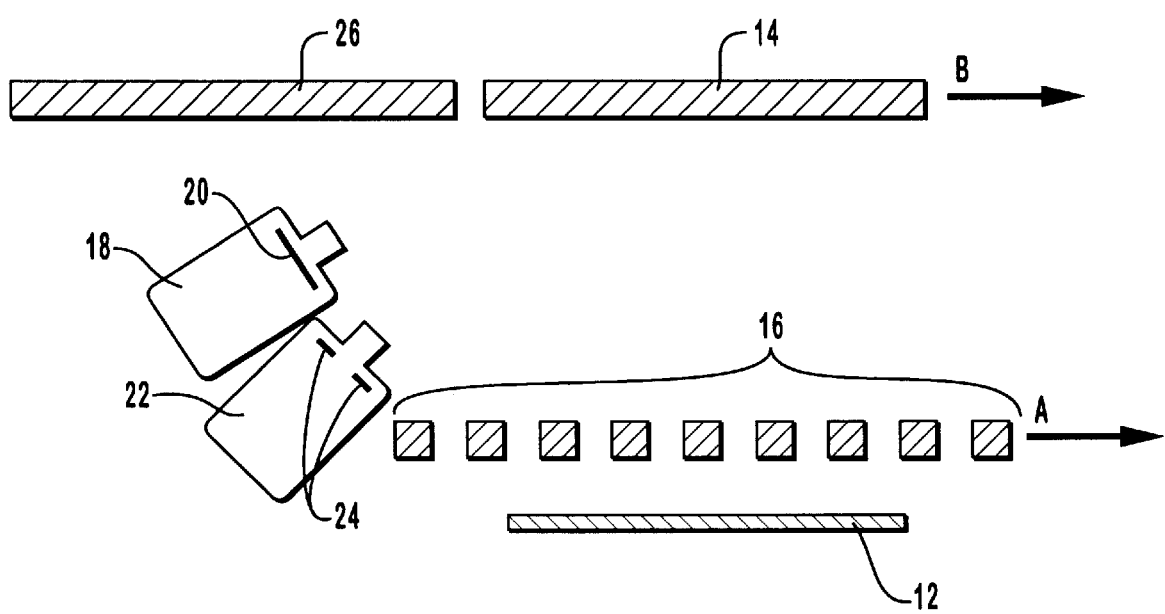
FIG. 4 is a schematic cross section of a portion of a collimated sputtering apparatus of the present invention for use in practicing the methods of the present invention.

FIG. 4 is a schematic cross section of a portion of a collimated sputtering apparatus. The apparatus of FIG. 4 is designed to allow a substrate 12 to remain stationary while a less-collimated and a collimated flux are directed toward the surface of substrate 12 by any of various means so as to respectively form lining 48 and fill void 50.

Substrate 12 is positioned opposite a target 14. A collimator 16 is positioned between substrate 12 and target 14, and may be removable in a direction A to provide less-collimated flux. Target 14 may be sputtered in a plasma, or by an ion gun 22. Multiple ion guns 22, 18 may also be employed, and the ion species and the angle of approach to target 14 may be individually selected for each gun so as to provide a less-collimated flux and a collimated flux according to the gun in use. Shutters 20, 24 may be employed to switch from one gun to the next.

An additional or second target 26 may also be employed in addition to target 14. in which case target 14 may be removable by motion in direction B and replaceable by target 26 during deposition. Target 26 may have an amorphous structure or other structure resulting in a less-collimated flux, while target 14 may be formed having a crystal structure and orientation favoring a collimated sputtered flux. Instead of being moveable, targets 14 and 26 may also be placed behind shutters. Any of the above features may be employed alone or in concert with others to first produce a less-collimated and then a collimated particle flux at the surface of wafer 12.

Figure 5:
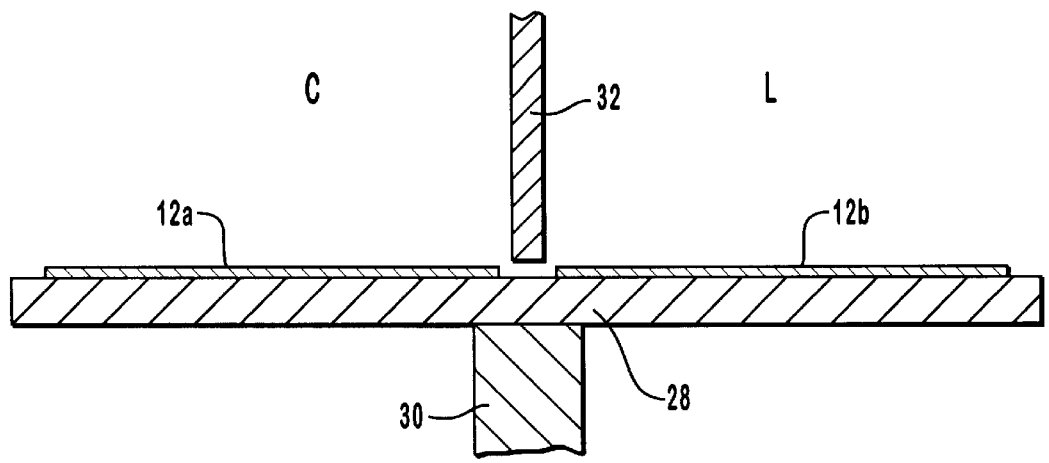
FIG. 5 is a schematic cross section of a portion of a collimated sputtering apparatus of the present invention with multiple moving substrates for use in practicing the methods of the present invention.

As an alternative to equipment intended for use with a stationary substrate, such as the equipment illustrated schematically in FIG. 4, a substrate or even multiple substrates, such as substrates 12a and 12b shown in FIG. 5, may be moved, such as by rotation, back and forth from an area of collimated flux to an area of less-collimated flux. As an example. substrates 12a and 12b of FIG. 5 may be supported on a platen 28. Platen 28 may rotate on a spindle 30 such that substrates 12a and 12b are alternately in an area C of collimated flux and an area L of less-collimated flux. Areas C and L may optionally be separated by a partition 32. The collimated flux in area C and the less collimated flux in area L may be produced by any acceptable means including for example any of the means for producing more or less collimation described herein.

Figure 6:
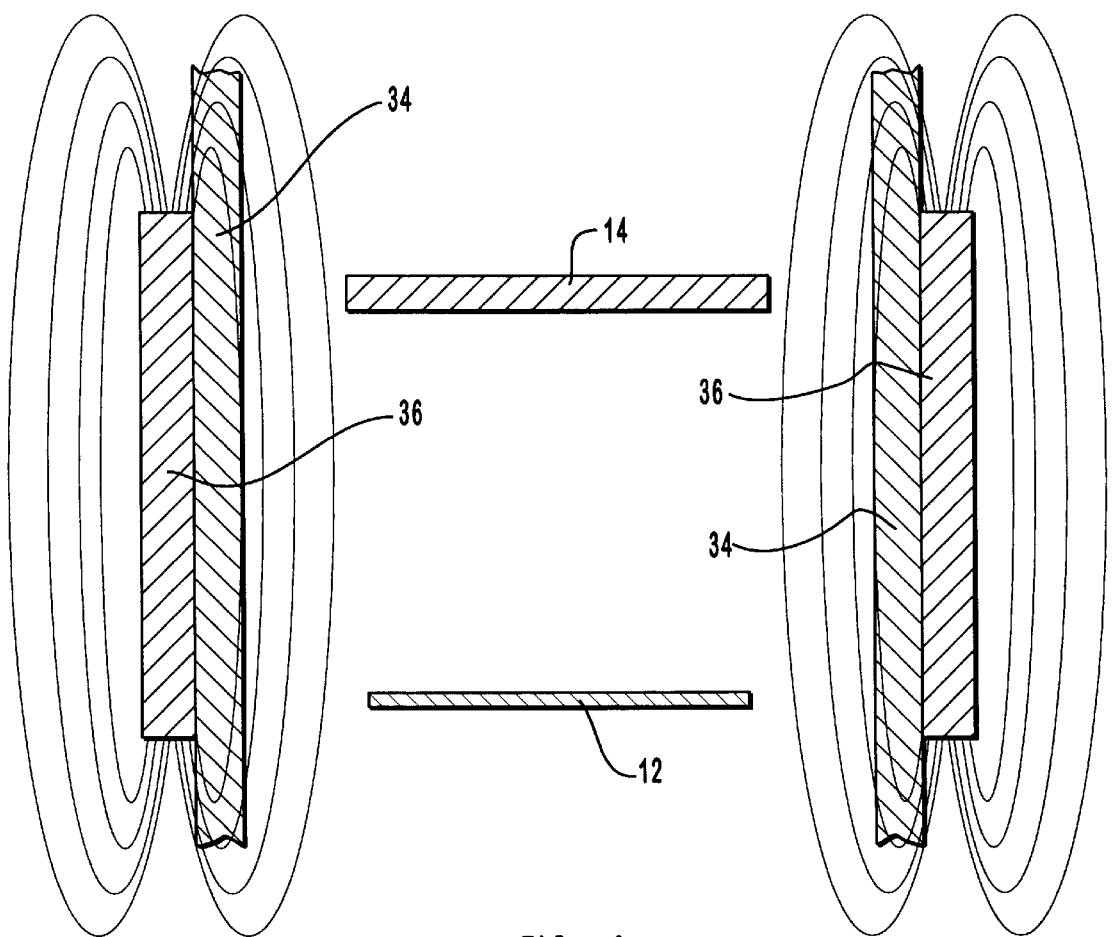
FIG. 6 is a schematic cross section of a portion of a collimated sputtering apparatus of the present invention having magnetic fields for use in practicing the methods of the present invention.

A confining magnetic field may also be used to assist in increasing the degree of collimation achieved. As illustrated in FIG. 6, permanent or coil magnets 36 may be located near the exterior of sputtering chamber walls 34, resulting in magnetic field lines located inside chamber walls 34 and running parallel thereto, with the density of the field lines increasing near the surface of chamber walls 34. The magnetic field should preferably extend from near target 14 to near substrate 12 as shown. Such a magnetic field repels electrons approaching chamber walls 36 so that less electrons are lost by conduction through chamber walls 36. With less electron loss, the plasma can be sustained at a lower pressure, allowing a greater mean free path for sputtered particles with a resulting decrease in scattering and increase in collimation. The magnetic field itself, if generated by coil magnets, may also be turned off to assist in providing a less-collimated flux.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for filling a structure in a semiconductor device comprising:
providing a substrate having thereon a space to be filled, the space having a side wall surface and a bottom surface;
forming a lining substantially covering the side wall surface of the space and not substantially covering the bottom surface of the space, the lining with the bottom surface defining a void within the space, the void having an opening thereto within the space; and then
filling the void with a material passing through the opening.

2. The method as defined in claim 1, wherein:
the lining is formed by deposition of a lining material in a direction that is not substantially parallel to the side wall surface of the space; and
the void is filled by the material which passes through the opening in a direction that is substantially parallel to the side wall surface of the space.

3. The method as defined in claim 1, wherein the side wall surface of the space is substantially orthogonal to at least one of the bottom surface of the space and the substrate.

4. The method as defined in claim 1, wherein the space has an aspect ratio of at least 2 to 1.

5. The method as defined in claim 1, wherein:
the lining is formed while applying a bias voltage at said substrate within the range of about −30 to about −500 V; and
the void is filled by while applying a bias voltage at said substrate within the range of about −30 to about 100 V.

6. The method as defined in claim 1, wherein:
while the lining is formed, the substrate is heated within the range of about 150° C. to about 700° C.; and
while the void is filled, the substrate is heated within the range of about −15° C. to about 150° C.

7. The method as defined in claim 1, wherein:
the lining is formed while applying a pressure to the substrate in a range from about 2 mTorr to about 10 mTorr; and
the void is filled by while applying a pressure to the substrate in a range from about 0.1 mTorr to about 2 mTorr.

8. The method as defined in claim 1, wherein the material filling the void substantially covers the bottom surface of the space.

9. The method as defined in claim 1, wherein;
the lining is formed by physical vapor deposition; and
the void is filled by chemical vapor deposition.

10. The method as defined in claim 9, wherein:
the lining is formed while applying a bias voltage at said substrate within the range of about −30 to about −500 v.

11. The method as defined in claim 1 wherein;
the lining is formed by a less-collimated sputtered particle flux; and
the void is filled by a collimated sputtered particle flux.

12. The method as defined in claim 11, wherein:
the lining is formed while applying a bias voltage at said substrate within the range of about −30 to about −500 v; and
the void is filled by while applying a bias voltage at said substrate within the range of about −30 to about 100 v.

13. The method as defined in claim 1, wherein;
the lining is formed by a particle flux sputtered in a sputtering plasma formed from a first gas having a neutral to ion ratio; and
the void is filled by a particle flux sputtered in a sputtering plasma formed from a second gas having a neutral to ion ratio lower than that of the first gas.

14. The method as defined in claim 13, wherein:
the lining is formed while applying a bias voltage at said substrate within the range of about −30 to about −500 v; and
the void is filled by while applying a bias voltage at said substrate within the range of about −30 to about 100 v.

15. The method as defined in claim 1, wherein;
the lining is formed by a particle flux sputtered in a sputtering plasma formed from a first gas having an atomic mass; and
the void is filled by a particle flux sputtered in a sputtering plasma formed from a second gas having an atomic mass lower than that of the first gas.

16. The method as defined in claim 15, wherein:

the lining is formed while applying a bias voltage at said substrate within the range of about −30 to about −500 v; and the void is filled by while applying a bias voltage at said substrate within the range of about −30 to about 100 v.

17. The method as defined in claim 1, wherein:

the lining is formed by sputtering from a target having a crystal structure not preferentially oriented to maximize collimation thereof; and the void is filled with a particle flux sputtered from a target having a crystal structure preferentially oriented to maximize collimation thereof.

18. The method as defined in claim 17, wherein:

the lining is formed while applying a bias voltage at said substrate within the range of about −30 to about −500 v; and the void is filled by while applying a bias voltage at said substrate within the range of about −30 to about 100 v.

19. The method as defined in claim 1, wherein said substrate is in a first position at which said lining is formed and is in a second position at which the void is filled, wherein the first and second positions are substantially the same.

20. The method as defined in claim 1, wherein said substrate is moved from a first position at which said lining is formed to a second position at which the void is filled, wherein the first and second positions are substantially different.

21. The method as defined in claim 1, wherein at least one of the forming of the lining and the filling of the void is a process of sputtering a target, the method further comprising providing a confining magnetic field extending from the target to the substrate to confine electrons.

22. The method as defined in claim 1, wherein filling the void through the opening further comprises:

applying at least one of heat and pressure to the material within the space.

23. A method for filling a structure in a semiconductor device comprising:

providing a substrate having thereon a space to be filled, the space having a side wall surface and a bottom surface, wherein the side wall surface of the space is substantially orthogonal to the bottom surface of the space and to the substrate, and wherein the space has an aspect ratio of at least 2 to 1;

forming a lining substantially covering the side wall surface of the space and not substantially covering the bottom surface of the space, the lining with the bottom surface defining a void within the space, the void having an opening thereto within the space, the lining being formed by deposition of a lining material in a direction that is not substantially parallel to the side wall surface of the space; and then filling the void with a material passing through the opening.

24. The method as defined in claim 23, wherein the void is filled by the material which passes through the opening in a direction that is substantially parallel to the side wall surface of the space.

25. A method for filling a structure in a semiconductor device comprising:

providing a substrate having thereon a space to be filled, the space having a side wall surface and a bottom surface;

sputtering a less-collimated sputtered particle flux to substantially cover the side wall surface of the space and to not substantially cover the bottom surface of the space; and then sputtering a collimated sputtered particle flux into the space to fill the space without voids.

26. The method as defined in claim 25, wherein the space has an aspect ratio of at least 2 to 1.

27. The method as defined in claim 26, wherein the space has a side wall surface that is substantially orthogonal to the substrate, and wherein:

the less-collimated sputtered particle flux is sputtered in a direction that is not substantially parallel to the side wall surface of the space; and the collimated sputtered particle flux is sputtered in a direction that is substantially parallel to the side wall surface of the space.

28. A method for filling a structure in a semiconductor device comprising:

providing a substrate having thereon a space to be filled, the space having a side wall surface and a bottom surface;

forming a lining with a less-collimated sputtered particle flux, the lining substantially covering the side wall surface of the space and not substantially covering the bottom surface of the space, the lining with the bottom surface defining a void within the space, the void having an opening thereto within the space; and then filling the void through the opening with a collimated sputtered particle flux, the collimated sputtered particle flux substantially covering the bottom surface of the space and the lining.

29. The method as defined in claim 28, wherein the space has a side wall surface that is substantially orthogonal to the substrate, and the space has an aspect ratio of at least 2 to 1, and wherein:

the sputtered particle flux forming the lining is sputtered in a direction that is not substantially parallel to the side wall surface of the space; and the sputtered particle flux filling the void is sputtered in a direction that is substantially parallel to the side wall surface of the space.

30. The method as defined in claim 28, wherein:

the collimated sputtered particle flux is sputtered from a target having a crystal structure preferentially oriented to maximize collimation thereof; and the less-collimated sputtered particle flux is sputtered from a target having a crystal structure not preferentially oriented to maximize collimation thereof.

31. The method as defined in claim 28, wherein, while the lining is formed and the void is filled, there is a variance of at least one of:

bias voltage applied at the substrate;

heat applied to the substrate; and pressure applied to the substrate.

32. The method as defined in claim 28, wherein said substrate is at a first position at which said substrate is exposed to said collimated sputtered particle flux and is at a second position at which said substrate is exposed to said less-collimated sputtered particle flux, wherein the first and second positions are substantially the same.

33. The method as defined in claim 28, wherein said substrate is moved from a first position at which said substrate is exposed to said collimated sputtered particle flux to a second position at which said substrate is exposed to said less-collimated sputtered particle flux, wherein the first and second positions are not substantially the same.

34. The method as defined in claim 28, further comprising providing a confining magnetic field extending from a sputtering target of at least one of the less-collimated sputtered particle flux the collimated sputtered particle flux to the substrate to confine electrons.

35. The method as defined in claim 28, wherein filling the void through the opening further comprises:
applying at least one of heat and pressure to the particle flux in the space to substantially fill the space with the sputtered particle flux.

36. A method for filling a structure in a semiconductor device comprising:
providing a substrate having thereon a space to be filled, said space having a side wall surface and a bottom surface;
sputtering a particle flux in a sputtering plasma formed from a first gas having a neutral to ion ratio to substantially covering the side wall surface of the space and not substantially covering the bottom surface of the space; and then
sputtering a particle flux in a sputtering plasma formed from a second gas having a neutral to ion ratio lower than that of the first gas to completely and voidlessly fill the space.

37. The method as defined in claim 36, wherein the space has an aspect ratio of at least 2 to 1.

38. The method as defined in claim 37, wherein the space has a side wall surface that is substantially orthogonal to the substrate, and wherein:
the sputtered particle flux partially filling the space is sputtered in a direction that is not substantially parallel to the side wall surface of the space; and
the sputtered particle flux substantially filling the space is sputtered in a direction that is substantially parallel to the side wall surface of the space.

39. A method for filling a structure in a semiconductor device comprising:
providing a substrate having thereon a space to be filled, the space having a side wall surface and a bottom surface;
forming a lining with a particle flux sputtered in a sputtering plasma formed from a first gas having a neutral to ion ratio, the lining substantially covering the side wall surface of the space and not substantially covering the bottom surface of the space, the lining with the bottom surface defining a void within the space, the void having an opening thereto within the space; and then
filling the void through the opening with a particle flux sputtered in a sputtering plasma formed from a second gas having a neutral to ion ratio lower than that of the first gas, the sputtered particle flux substantially covering the bottom surface of the space and the lining.

40. The method as defined in claim 39, wherein the space has a side wall surface that is substantially orthogonal to the substrate, and the space has an aspect ratio of at least 2 to 1, and wherein:
the sputtered particle flux forming the lining is sputtered in a direction that is not substantially parallel to the side wall surface of the space; and
the sputtered particle flux filling the void is sputtered in a direction that is substantially parallel to the side wall surface of the space.

41. The method as defined in claim 39, wherein:
the particle flux sputtered in the sputtering plasma formed from the second gas is sputtered from a target having a crystal structure preferentially oriented to maximize collimation thereof; and
the lining is formed by sputtering from a target having a crystal structure not preferentially oriented to maximize collimation thereof.

42. The method as defined in claim 39, wherein said substrate is at a first position at which said lining is formed and is at a second position at which said substrate is exposed to the particle flux sputtered in the sputtering plasma formed from the second gas, wherein the first and second positions are substantially the same.

43. The method as defined in claim 39, wherein said substrate is moved from a first position at which said lining is formed to a second position at which said substrate is exposed to the particle flux sputtered in the sputtering plasma formed from the second gas, wherein the first and second positions are not substantially the same.

44. The method as defined in claim 39, fuirther comprising providing a confining magnetic field extending from a sputtering target of the particle flux sputtered in the sputtering plasma formed from at least one of the first and second gases to confine electrons.

45. The method as defined in claim 39, wherein filling the void through the opening further comprises:
applying at least one of heat and pressure to the sputtered particle flux in the space to substantially fill the space with the sputtered particle flux.

46. The method as defined in claim 39, wherein, while the lining is formed and the void is filled, there is a variance of at least one of:
bias voltage applied at the substrate;
heat applied to the substrate; and
pressure applied to the substrate.

47. A method for filling a structure in a semiconductor device comprising:
providing a substrate having thereon a space to be filled, said space having a side wall surface and a bottom surface;
sputtering a particle flux in a sputtering plasma formed from a first gas having an atomic mass to substantially cover the side wall surface of the space and not substantially cover the bottom surface of the space; and then
sputtering a particle flux in a sputtering plasma formed from a second gas having an atomic mass lower than that of the first gas to completely and voidlessly fill the space.

48. The method as defined in claim 47, wherein the space has an aspect ratio of at least 2 to 1.

49. The method as defined in claim 48, wherein the space has a side wall surface that is substantially orthogonal to the substrate, and wherein:
the sputtered particle flux partially filling the space is sputtered in a direction that is not substantially parallel to the side wall surface of the space; and
the sputtered particle flux substantially filling the space is sputtered in a direction that is substantially parallel to the side wall surface of the space.

50. A method for filling a structure in a semiconductor device comprising:
providing a substrate having thereon a space to be filled, the space having a side wall surface and a bottom surface;

forming a lining substantially covering the side wall surface of the space with a particle flux sputtered in a sputtering plasma formed from a first gas having an atomic mass, the lining with the bottom surface defining a void within the space, the lining not substantially covering the bottom surface of the space, the void having an opening thereto within the space; and then filling the void through the opening with a particle flux sputtered in a sputtering plasma formed from a second gas having an atomic mass lower than that of the first gas, the sputtered particle flux substantially covering the bottom surface of the space and the lining.

51. The method as defined in claim 50, wherein the space has a side wall surface that is substantially orthogonal to the substrate, and the space has an aspect ratio of at least 2 to 1, and wherein:

the sputtered particle flux forming the lining is sputtered in a direction that is not substantially parallel to the side wall surface of the space; and the sputtered particle flux filling the void is sputtered in a direction that is substantially parallel to the side wall surface of the space.

52. The method as defined in claim 50, wherein:

the particle flux sputtered in the sputtering plasma formed from the second gas is sputtered from a target having a crystal structure preferentially oriented to maximize collimation thereof; and the lining is formed by sputtering from a target having a crystal structure not preferentially oriented to maximize collimation thereof.

53. The method as defined in claim 50, wherein said substrate is at a first position at which said lining is formed and is at a second position at which said substrate is exposed to the particle flux sputtered in the sputtering plasma formed from the second gas, wherein the first and second positions are substantially the same.

54. The method as defined in claim 50, wherein said substrate is moved from a first position at which said lining is formed to a second position at which said substrate is exposed to the particle flux sputtered in the sputtering plasma formed from the second gas, wherein the first and second positions are not substantially the same.

55. The method as defined in claim 50, further comprising providing a confining magnetic field extending from a sputtering target of the particle flux sputtered in the sputtering plasma formed from at least one of the first and second gases to confine electrons.

56. The method as defined in claim 50, wherein filling the void through the opening further comprises:

applying at least one of heat and pressure to the sputtered particle flux in the space to substantially fill the space with the sputtered particle flux.

57. The method as defined in claim 50, wherein, while the lining is formed and the void is filled, there is a variance of at least one of:

bias voltage applied at the substrate;

heat applied to the substrate; and pressure applied to the substrate.

58. A method for filling a structure in a semiconductor device comprising:

providing a substrate having thereon a space to be filled, said space having a side wall surface and a bottom surface;

sputtering a particle flux in a sputtering plasma to substantially cover the side wall surface of the space and not substantially cover the bottom surface of the space; and then performing a chemical vapor deposition of a material to completely and voidlessly fill the space.

59. The method as defined in claim 58, wherein the space has an aspect ratio of at least 2 to 1.

60. The method as defined in claim 59, wherein the space has a side wall surface that is substantially orthogonal to the substrate, and wherein:

the sputtered particle flux partially filling the space is sputtered in a direction that is not substantially parallel to the side wall surface of the space; and the material is deposited in a direction that is substantially parallel to the side wall surface of the space.

61. A method for filling a structure in a semiconductor device comprising:

providing a substrate having thereon a space to be filled, the space having a side wall surface and a bottom surface;

forming a lining to substantially cover the side wall surface of the space by physical vapor deposition, the lining with the bottom surface defining a void within the space, and the lining not substantially covering the bottom surface of the space, the void having an opening thereto within the space; and then filling the void by chemical vapor deposition of a material passing through the opening, the material substantially covering the bottom surface of the space and the lining.

62. The method as defined in claim 61, wherein the space has a side wall surface that is substantially orthogonal to the substrate, and the space has an aspect ratio of at least 2 to 1, and wherein:

the sputtered particle flux forming the lining is sputtered in a direction that is not substantially parallel to the side wall surface of the space.

63. The method as defined in claim 61, wherein:

a sputtered particle flux from the physical vapor deposition is from a target having a crystal structure not preferentially oriented to maximize collimation thereof.

64. The method as defined in claim 61, further comprising providing a confining magnetic field extending from a target of the physical vapor deposition to the substrate to confine electrons.

65. The method as defined in claim 61, wherein filling the void through the opening further comprises:

applying at least one of heat and pressure to the material in the space to substantially fill the space.

66. The method as defined in claim 61, wherein, while the lining is formed and the void is filled, there is a variance of at least one of:

bias voltage applied at the substrate;

heat applied to the substrate; and pressure applied to the substrate.

67. A method for filling a structure in a semiconductor device comprising:

providing a substrate having thereon a space to be filled having an aspect ratio of at least 2 to 1, the space having a side wall surface and a bottom surface wherein the side wall surface of the space is substantially orthogonal to at least one of the bottom surface of the space and the substrate;

forming a lining substantially covering the side wall surface of the space and not substantially covering the bottom surface of the space, the lining with the bottom surface defining a void within the space, the void having an opening thereto within the space, wherein the lining is formed by deposition of a lining material in a direction that is not substantially parallel to the side wall surface of the space, wherein the lining is formed while:

applying a bias voltage at said substrate within the range of about −30 to about −500 v;

heating the substrate within the range of about 150° C. to about 700° C.; and applying a pressure to the substrate in a range from about 2 mTorr to about 10 mTorr; and then filling the void with a material passing through the opening in a direction that is substantially parallel to the side wall surface of the space, wherein the void is filled while:

applying a bias voltage at said substrate within the range of about −30 to about 100 v;

heating the substrate within the range of about −15° C. to about 150° C.; and applying a pressure to the substrate in a range from about 0.1 mTorr to about 2 mTorr.

* * * * *

UNITED STATES PATENT AND TRADEMARK OFFICE
CERTIFICATE OF CORRECTION

PATENT NO. : 5,985,103
DATED : Nov. 16, 1999
INVENTOR(S) : John H. Givens; Richard L. Elliott It is certified that error appears in the above-indentified patent and that said Letters Patent is hereby corrected as shown below:

Col. 1, line 28, after "to be" delete "a"

Col. 1, line 53, after "then" change "define" to --defines--

Col. 3, line 3, after "lining" change "48." to --48,--

Col. 3, line 49, after "of" change "he" to --the--

Col. 4, lines 17, 22, and 31, before "while" delete "by"

Col. 4, line 66, after "target" change "14." to --14,--

Col. 5, line 15, change "example." to --example,--

Col. 6, lines 13, 24, 45, and 59, before "while" delete "by"

Col. 7, lines 5 and 19, before "while" delete "by"

Col. 9, line 3, insert --and-- before "the"

Col. 9, lines 20 and 21, change "covering" to --cover--

Signed and Sealed this

Sixth Day of March, 2001

Attest:

NICHOLAS P. GODICI

Attesting Officer

Acting Director of the United States Patent and Trademark Office